United States Patent
Damitio et al.

(10) Patent No.: US 7,626,458 B2
(45) Date of Patent: Dec. 1, 2009

(54) COMMON-MODE BANDWIDTH REDUCTION CIRCUIT AND METHOD FOR DIFFERENTIAL APPLICATIONS

(75) Inventors: Paul G. Damitio, Tucson, AZ (US); Ahmad Dashtestani, Tucson, AZ (US)

(73) Assignee: Texas Instruments Incorporated, Dalls, TX (US)

(*) Notice: Subject to any disclaimer, the term of this patent is extended or adjusted under 35 U.S.C. 154(b) by 67 days.

(21) Appl. No.: 11/903,105

(22) Filed: Sep. 20, 2007

(65) Prior Publication Data
US 2009/0058525 A1   Mar. 5, 2009

Related U.S. Application Data

(60) Provisional application No. 60/968,497, filed on Aug. 28, 2007.

(51) Int. Cl.
*H03F 3/45* (2006.01)
(52) U.S. Cl. .............. 330/257; 330/255; 330/260; 330/267
(58) Field of Classification Search ............ 330/255, 330/257, 258, 260, 263, 265, 267
See application file for complete search history.

(56) References Cited

U.S. PATENT DOCUMENTS

| 6,586,997 B1 * | 7/2003 | D'Aquino et al. ........... 330/257 |
| 6,867,649 B2 | 3/2005 | Lehto ........................ 330/252 |
| 7,132,860 B2 * | 11/2006 | Lehto ........................ 330/252 |
| 2002/0021176 A1 | 2/2002 | Enriquez |
| 2002/0084851 A1 | 7/2002 | Liu et al. |
| 2002/0175760 A1 | 11/2002 | Harvey |
| 2003/0184386 A1 | 10/2003 | Varner et al. |
| 2005/0206452 A1 | 9/2005 | Lehto |

FOREIGN PATENT DOCUMENTS

EP    1 239 603   11/2002

* cited by examiner

*Primary Examiner*—Khanh V Nguyen
(74) *Attorney, Agent, or Firm*—John J. Patti; Wade J. Brady, III; Frederick J. Telecky, Jr.

(57) ABSTRACT

An amplifier driver circuit (10) includes first (11-1) and second (11-2) feedback amplifiers including first (14-1) and second (14-2) upper current mirrors, respectively, and first (16-1) and second (16-2) lower current mirrors, respectively, first (12-1) and second (12-2) amplifier input stages receiving a common mode input signal, and first (18-1) and second (18-2) amplifier output stages coupled to outputs of the first and second amplifier input stages, respectively. Each current mirror has an input (IN) and first (OUT1) and second (OUT2) outputs. Upper bias terminals of the first (12-1) and second (12-2) amplifier input stages are coupled to the inputs (IN) of the first (14-1) and second (14-2) upper current mirrors, respectively, and are cross-coupled to the second outputs (OUT2) of the second (16-2) and first (16-1) lower current mirrors, respectively. Lower bias terminals of the first (12-1) and second (12-2) amplifier input stages are coupled to the inputs (IN) of the first (16-1) and second (16-2) lower current mirrors, respectively, and are cross-coupled to the second outputs (OUT2) of the second (14-2) and first (14-1) upper current mirrors, respectively, to oppose signals at the inputs (IN) of the current mirrors in response to the common mode input signal.

23 Claims, 9 Drawing Sheets

COMMON-MODE BANDWIDTH REDUCTION CIRCUIT AND METHOD FOR DIFFERENTIAL APPLICATIONS

CROSS REFERENCE TO RELATED APPLICATION

This application claims the benefit of a first prior filed U.S. provisional application Serial No. 60/968,497 filed Aug. 28, 2007, entitled "Common Mode Bandwidth Reduction in Differential Applications", by Paul G. Damitio and Ahmad Dashtestani, and incorporated herein by reference.

BACKGROUND OF THE INVENTION

The present invention relates generally to amplifier driver circuits, particularly to amplifier driver circuits composed of current feedback amplifiers, and more particularly to such amplifier driver circuits which avoid instability in response to both differential input signals and common-mode input signals. The invention also relates to amplifier driver circuits composed of voltage feedback amplifiers, and more particularly to such amplifier driver circuits which avoid instability in response to both differential input signals and common-mode input signals.

Current feedback amplifiers (CFA) are generally considered to be the best candidates for DSL applications for a number of reasons, including their higher slew rates and low inverting-input impedances, to name a few. Most CFAs are made of an input buffer, 2 main current mirrors, and an output stage. In certain amplifier driver applications, such as DSL (Digital Subscriber Line) applications, a pair of current feedback amplifiers are connected together to form a differential amplifier driver circuit. (An equivalent circuit of a current feedback amplifier is shown in FIG. 9)

"Prior Art" FIG. 1 herein illustrates a conventional current feedback amplifier. The gain of differential amplifier driver circuits typically is set to a value of approximately ten. To maximize the bandwidth of differential amplifier driver circuits, the pair of individual amplifiers in such a differential amplifier driver circuit are internally compensated such that they are optimized to operate at these higher gains. Consequently, the individual amplifiers and hence the differential amplifier driver circuits amplifiers composed thereof tend to be unstable if operated at lower gains, and particularly at a gain of unity. This represents a severe problem for the differential amplifier driver circuits when used in DSL applications. In this case, even though the differential amplifier driver circuit is set up for a gain of ten when amplifying differential input signals, it actually operates with a gain of one when amplifying common mode input signals. Because of this, the differential amplifier driver circuit is susceptible to common mode instability.

An alternate compensation method uses AC coupling of each of a pair of individual amplifiers of which a differential amplifier driver circuit is constructed in such a way that the individual amplifiers "see" smaller compensation capacitances during differential input signal amplifying operation and larger compensation capacitances in common mode input signal amplifying operation. U.S. Pat. No. 6,867,649 entitled "Common-Mode and Differential-Mode Compensation for Operational Amplifier Circuits" issued Mar. 15, 2005 to Jeffrey S. Lehto describes the method. "Prior Art" FIG. 2A is a copy of FIG. 4 of U.S. Pat. No. 6,867,649, wherein a compensation scheme is provided for two interconnected amplifier circuits that allows independent frequency compensation of the common-mode and differential signal paths. This method can be used to stabilize differential circuits without compromising performance through over-compensation, and without any need to isolate the amplifiers from one another. However, as a matter of actual circuit implementation, adding an inverting amplifier to each amplifier block is not practical. Specifically, FIG. 2A is a very basic diagram of the circuit, and implementing the illustrated amplifiers 406 and 416 with a gain of −1 is impractical.

"Prior Art" FIG. 2B herein is a copy of FIG. 5 of U.S. Pat. No. 6,867,649, and shows a practical implementation of the invention disclosed therein. This circuit includes two operational amplifier amplifiers $AMP_A$ and $AMP_B$. The amplifiers making up $AMP_A$ and $AMP_B$ can use any operational amplifier topology including voltage feedback and current feedback methods, and can be made from any transistor technology including, but not limited to, bipolar and MOSFET devices. The amplifiers $AMP_A$ and $AMP_B$ each include a transconductance stage and output buffer, similar to FIG. 1. Circuitry is further included in each of amplifiers $AMP_A$ and $AMP_B$ to form an inverter, with the inverter having an input connected to the gain node at the output of the transconductance stage.

Common mode compensation is provided by connecting capacitors from the gain node at the input of an inverter in one of the amplifiers $AMP_A$ or $AMP_B$ to the output of the inverter in the other amplifier. For the bipolar current feedback amplifiers, two capacitors having a value $C_{COMMON}/2$ are connected together in each of amplifiers $AMP_A$ and $AMP_B$ on one end to the output of current mirrors which are connected to effectively form the output of the inverter, and separately to separate inputs of the current mirrors in the opposing amplifiers $AMP_A$ or $AMP_B$.

Although the signals of the above mentioned current mirrors are in fact 180 degrees out of phase with one another and thus in a sense form the inputs and outputs of inverters, it is also true that these inputs and outputs are of greatly differing amplitudes. Thus, for differential mode signals, the illustrated "$C_{COMMON}/2$" capacitors in fact have substantial changing voltages across them. Since the current through a capacitor is $i(t)=C(dv/dt)$, charging and discharging currents must be supplied to the common mode compensation capacitors during differential mode operation. Because of the symmetry of the connection of the compensation capacitors to the high impedance nodes and to the current mirror inputs, the discharge current of one capacitor is mirrored to become the charge current of another. This effectively makes the common mode compensation capacitors seem almost "invisible" to the high impedance node during differential mode operation, but these currents must flow in the signal current mirrors. This places an undesirable burden on the signal current mirrors which increases with frequency and amplitude. In fact, depending on the magnitude of the charging currents and discharging currents, there is a significant likelihood of high internal AC power dissipation and the possibility of inadequate full power bandwidth of circuits implementing this compensation method.

More specifically, the input signals applied to current mirrors 510 and 562 of FIG. 2B are the inputs to the inverting amplifiers therein. That is, according to the teaching of U.S. Pat. No. 6,867,649, current mirrors 510 and 562 can be thought of as functioning as an inverting amplifiers. However, that actually is incorrect because in current mirror 510, the collector of transistor 521 is held nearly constant at 2 VBE voltage drops below the supply voltage VCC. In the circuit of Prior Art FIG. 2B herein, the collectors of output transistors 503, 504, 553, and 554 have to provide the charging currents and discharging currents to the compensation capacitors $C_{COMP}$. The foregoing transistors charge and discharge the compensation capacitors asymmetrically when amplification of the differential input signal occurs in the differential mode. Transistors 503 and 504 (and also transistors 533 and 534) function similarly in either differential mode or common mode operation. One of the current mirrors will be providing additional current beyond what it would ordinarily be provided to charge the large capacitances. However, when the amplification is common mode amplification, the burden of charging and discharging capacitors 514 and 516 (and also capacitors 564 and 566) actually falls entirely on the current mirror output transistors, necessitating the use of substantially larger transistor geometries than would normally be used. For example, if capacitor 514 is being charged, capacitor 516 will be discharging at the same time. These currents will be summed at node VB and be provided from the output transistor of current mirror 562. The current provided by that transistor will be boosted because the opposite capacitors 564 and 566 are discharging into its base so it can provide the charging current to the other set of capacitors 514 and 516. At the same time current mirror 562 is being boosted, current mirror 560 will be turned off because there is an absence of current at the summing node VB. As the frequency increases, larger transistors are needed to supply the current in one current mirror at the same time the other current mirror is being turned off. The above mentioned over-sizing of transistors tends to degrade/distort large signal circuit performance of the amplifier.

The charging current of capacitor 514 will flow into the input of current mirror 510 and also out of its output, while the discharge current of capacitor 516 will cause the current of mirror 512 to decrease. Then the additional current flowing in the output of current mirror 510 will provide the charge and discharge currents of capacitors 564 and 566. These currents in turn cause the current of mirrors 562 and 560 to increase and decrease, respectively. At high amplitudes/frequencies, the discharging capacitors can actually cause the current mirror inputs to be driven below VEE on the negative side and above VCC on the positive side. This, as well as the high charge/discharge current flowing in the complementary current mirror, limits large signal bandwidth, and also results in substantial additional power dissipation. Also, if transistors 503, 504, 553, and 554 are not made sufficiently large, they will have difficulty supplying the charging currents and discharging currents, and therefore those transistors will have a tendency to saturate at high signal levels. This causes the large signal frequency response of the differential amplifier driver circuit in U.S. Pat. No. 6,867,649 to deteriorate rapidly as the signal level increases. Consequently, there is a substantial need for a differential amplifier driver circuit that does not have the foregoing problems.

Differential mode compensation can be provided by connecting a capacitor with value $C_{COMP}/2$ from the gain node to ground of each of the amplifiers $AMP_A$ or $AMP_B$, similar to the compensation provided in amplifier 100 of FIG. 1. Alternatively, both differential mode and Miller effect compensation can be provided by connecting capacitors from the input to the output of components forming the inverter in each of the amplifiers $AMP_A$ and $AMP_B$. For the MOSFET differential amplifiers, differential and Miller effect compensation is provided by connecting a capacitor having a value $C_{COMP}/2$ between the inverting and non-inverting outputs in each amplifier. For bipolar current feedback amplifiers, a capacitance of $C_{COMP}/2$ is connected between the output of current mirrors forming the gain node, and each current mirror input. As a further alternative, differential and common mode compensation can be provided independently by connecting a capacitor with value $C_{DIFF}$ between the outputs of the inverters of the amplifiers $AMP_A$ and $AMP_B$.

A major disadvantage of the foregoing circuit is that the large common mode compensation capacitors must be complementarily charged and discharged for differential mode signals. Although this method functions very well for small signals at moderate frequencies, it suffers from high internal power dissipation as the frequency is increased and it has limited large signal bandwidth capability.

Thus, there is an unmet need for a differential amplifier driver circuit which avoids instability in response to both differential input signals and common-mode input signals and which also has higher full power bandwidth than the closest prior art.

There also is an unmet need for a differential amplifier driver circuit which avoids instability in response to both differential input signals and common-mode input signals and which dissipates less power at high frequencies than the closest prior art.

There also is an unmet need for a differential amplifier driver circuit which avoids the impracticability of the prior art circuitry shown in U.S. Pat. No. 6,867,649 and its problems of high internal power dissipation and inability to provide high full power signal bandwidth.

SUMMARY OF THE INVENTION

It is an object of the invention to provide a differential amplifier driver circuit which avoids instability in response to both differential input signals and common-mode input signals and which also has higher full power bandwidth than the closest prior art.

It is another object of the invention to provide a differential amplifier driver circuit which avoids instability in response to both differential input signals and common-mode input signals and which dissipates less power at high frequencies than the closest prior art.

It is another object of the invention to provide a differential amplifier driver circuit which avoids the impracticability of the prior art circuitry shown in U.S. Pat. No. 6,867,649 and its problems of high internal power dissipation and inability to provide high full power signal bandwidth.

Briefly described, and in accordance with one embodiment, the present invention provides an amplifier driver circuit (10) including first (11-1) and second (11-2) feedback amplifiers which include first (14-1) and second (14-2) upper current mirrors, respectively, and also including first (16-1) and second (16-2) lower current mirrors, respectively, and also including first (12-1) and second (12-2) amplifier input stages receiving a common mode input signal, and first (18-1) and second (18-2) amplifier output stages coupled to outputs of the first and second amplifier input stages, respectively. Each current mirror has an input (IN) and first (OUT1) and second (OUT2) outputs. Upper bias terminals of the first (12-1) and second (12-2) amplifier input stages are coupled to the inputs (IN) of the first (14-1 and second) upper current mirrors, respectively, and are cross-coupled to the second outputs (OUT2) of the second (16-2) and first (16-1) lower current mirrors, respectively. Lower bias terminals of the first (12-1) and second (12-2) amplifier input stages are coupled to the inputs (IN) of the first (16-1) and second (16-2) lower current mirrors, respectively, and are cross-coupled to the second outputs (OUT2) of the second (14-2) and first (14-1) upper current mirrors, respectively, so as to oppose signals at the inputs (IN) of the current mirrors in response to the common mode input signal.

In one embodiment, the invention provides an amplifier driver circuit (10) including a first feedback amplifier (11-1) which include first (14-1) and second (16-1) current mirrors, a first amplifier input stage (12-1) having an input coupled to a first input signal (Vin$^+$) and an output (30-1), and a first amplifier output stage (18-1) having an output coupled to produce a first output signal (Vout$^+$), each of the first (14-1) and second (16-1) current mirrors including an input (IN), a first output (OUT1), and a second output (OUT2), the first outputs (OUT1) of the first (14-1) and second (16-1) current mirrors being coupled to a first compensation capacitance (Cc1) and to an input of the first amplifier input stage (18-1). A second feedback amplifier (11-2) includes third (14-2) and fourth (16-2) current mirrors, a second amplifier input stage (12-2) having an input coupled to a second input signal (Vin$^-$) and an output (30-2), and a second amplifier output stage (18-2) having an output coupled to produce a second output signal (Vout$^-$). Each of the third (14-2) and fourth (16-2) current mirrors includes an input (IN), a first output (OUT1), and a second output (OUT2). The first outputs (OUT1) of the third (14-2) and fourth (16-2) current mirrors are coupled to a second compensation capacitance (Cc2) and to an input of the second amplifier input stage (18-2). An upper bias terminal of the first amplifier input stage (12-1) is coupled to the input (IN) of the first current mirror (14-1) and the second output (OUT2) of the fourth current mirror (16-2). A lower bias terminal of the first amplifier input stage (12-1) is coupled to the input (IN) of the second current mirror (16-1) and the second output (OUT2) of the third current mirror (14-2) to cause signals at the second outputs (OUT2) of the third (14-2) and fourth (16-2) current mirrors to oppose signals at the inputs (IN) of the second (16-1) and first (14-1) current mirrors, respectively, in response to a common mode component of a differential input signal (Vin$^+$–Vin$^-$) equal to the difference between the first (Vin$^+$) and second (Vin$^-$) input signals. An upper bias terminal of the second amplifier input stage (12-2) is coupled to the input (IN) of the third current mirror (14-2) and the second output (OUT2) of the second current mirror (16-1). A lower bias terminal of the second amplifier input stage (12-2) is coupled to the input (IN) of the fourth current mirror (16-2) and the second output (OUT2) of the first current mirror (14-1) to cause signals at the second outputs (OUT2) of the first (14-1) and second (16-1) current mirrors to oppose signals at the inputs (IN) of the fourth (16-2) and third (14-2) current mirrors, respectively, in response to the common mode component of the differential input signal (Vin$^+$–Vin$^-$).

In one embodiment the first (11-1) and second (11-2) feedback amplifiers are current feedback amplifiers, and in another embodiment the first (11-1) and second (11-2) feedback amplifiers are voltage feedback amplifiers.

In one embodiment, each of the first (14-1), second (16-1), third (14-2) and fourth (16-2) current mirrors has a third output (OUT3). An upper bias terminal of the first amplifier output stage (18-1) is coupled to the third output (OUT3) of the first current mirror (14-1). A lower bias terminal of the first amplifier output stage (18-1) is coupled to the third output (OUT3) of the second current mirror (16-1). An upper bias terminal of the second amplifier output stage (18-2) is coupled to the third output (OUT3) of the third current mirror (14-2). A lower bias terminal of the second amplifier output stage (18-2) is coupled to the third output (OUT3) of the fourth current mirror (16-2).

In an embodiment wherein the feedback amplifiers are current feedback amplifiers, a gain resistor (RG) is coupled between the outputs (30-1,2) of the first (12-1) and second (12-2) amplifier input stages. In an embodiment wherein the feedback amplifiers are voltage feedback amplifiers, a first feedback resistor (R$_{FB}$-1) is coupled between the outputs of the first amplifier input stage (12-1) and the first amplifier output stage (18-1), and a second feedback resistor (R$_{FB}$-2) is coupled between the outputs of the second amplifier input stage (12-2) and the second amplifier output stage (18-2).

In the described embodiments, the first (11-1) and second (11-2) feedback amplifiers are operative with a complementary out-of-phase internal signals in response to the differential component of the differential input signal (Vin$^+$–Vin$^-$) to effectuate amplification of the differential input signal (Vin$^+$–Vin$^-$) by a gain substantially greater than 1. In the described embodiments, the first (12-1) and second (12-2) amplifier input stages each include a diamond buffer circuit. In the described embodiments, the ratio of input current in each of the first (14-1), second (16-1), third (14-2) and fourth (16-2) current mirrors to the output currents thereof is 2:1. In the described embodiments, the first current mirror (14-1) includes a diode-connected current mirror input transistor (Q5A) and first (Q11A) and second (Q9A) current mirror output transistors, the current mirror input transistor (Q5A) having twice the current-carrying capability of the first (Q11A) and second (Q9A) current mirror output transistors.

In a described embodiment, each of the first (11-1) and second (11-2) the feedback amplifiers has a transfer characteristic represented by $$\frac{Vo}{V1} = G\frac{N(s)}{N(s) + 3RfD(s)}$$

wherein V1 represents an input of the feedback amplifier, V0 represents an output of the feedback amplifier, Rf is a feedback resistance of the feedback amplifier, N(s) represents the numerator of a transfer function of the amplifier driver circuit in the frequency domain, D(s) represents the denominator of the transfer function bolt that and the frequency domain, and G represents a gain of the feedback amplifier.

In one embodiment, the first feedback amplifier is a first voltage feedback amplifier (11-1) and the second feedback amplifier is a second voltage feedback amplifier (11-2), and the first amplifier input stage includes a first diamond buffer circuit (12-1) having an input coupled to the first input signal (Vin$^+$) and a second diamond buffer circuit (25-1) having an input coupled by a first feedback resistor (RFB) to the output of the first amplifier output stage (18-1) and an output coupled by a first transconductance resistor (Rgm) to the output of the first diamond buffer circuit (12-1). The second amplifier input stage includes a third diamond buffer circuit (12-2) having an input coupled to the second input signal (Vin$^-$) and a fourth diamond buffer circuit (25-2) having an input coupled by a second feedback resistor (RFB) to the output of the second amplifier output stage (18-2) and an output coupled by a second transconductance resistor (Rgm) to the output of the second diamond buffer circuit (12-2). A gain resistor (RG) is coupled between the inputs of the first (25-1) and second (25-2) diamond buffer circuits.

In one embodiment, the invention provides a method for reducing the common mode bandwidth of an amplifier driver circuit (10) without substantially reducing its differential mode bandwidth wherein the amplifier driver circuit (10) includes a first feedback amplifier (11-1) including first (14-1) and second (16-1) current mirrors, a first amplifier input stage (12-1) having an input coupled to a first input signal (Vin$^+$) and an output (30-1), and a first amplifier output stage (18-1) having an output coupled to produce a first output signal (Vout⁺), each of the first (14-1) and second (16-1) current mirrors including an input (IN) and a first output (OUT1), the first outputs (OUT1) of the first (14-1) and second (16-1) current mirrors being coupled to a first compensation capacitor (Cc1) and to an input of the first amplifier input stage (18-1), and a second feedback amplifier (11-2) including third (14-2) and fourth (16-2) current mirrors, a second amplifier input stage (12-2) having an input coupled to a second input signal (Vin⁻) and an output (30-2), and a second amplifier output stage (18-2) having an output coupled to produce a second output signal (Vout⁻), each of the third (14-2) and fourth (16-2) current mirrors including an input (IN), a first output (OUT1), and a second output (OUT2), the first outputs (OUT1) of the third (14-2) and fourth (16-2) current mirrors being coupled to a second compensation capacitor (Cc2) and to an input of the second amplifier input stage (18-2), wherein the method includes providing a second output (OUT2) in each of the first (14-1), second (16-1), third (14-2) and fourth (16-2) current mirrors, coupling an upper bias terminal of the first amplifier input stage (12-1) to the input (IN) of the first current mirror (14-1) and the second output (OUT2) of the fourth current mirror (16-2) and coupling a lower bias terminal of the first amplifier input stage (12-1) to the input (IN) of the second current mirror (16-1) and the second output (OUT2) of the third current mirror (14-2) to cause signals at the second outputs (OUT2) of the third (14-2) and fourth (16-2) current mirrors to oppose signals at the inputs (IN) of the second (16-1) and first (14-1) current mirrors, respectively, in response to a common mode component of a differential input signal (Vin⁺−Vin⁻) equal to the difference between the first (Vin⁺) and second (Vin⁻) input signals, and coupling an upper bias terminal of the second amplifier input stage (12-2) to the input (IN) of the third current mirror (14-2) and the second output (OUT2) of the second current mirror (16-1) and coupling a lower bias terminal of the second amplifier input stage (12-2) to the input (IN) of the fourth current mirror (16-2) and the second output (OUT2) of the first current mirror (14-1) to cause signals at the second outputs (OUT2) of the first (14-1) and second (16-1) current mirrors to oppose signals at the inputs (IN) of the fourth (16-2) and third (14-2) current mirrors, respectively, in response to the common mode component of the differential input signal (Vin⁺−Vin⁻).

In one embodiment, the invention provides an amplifier driver circuit including a first feedback amplifier (11-1) which includes first (14-1) and second (16-1) current mirrors, a first amplifier input stage (12-1) having an input coupled to a first input signal (Vin⁺) and an output (30-1), and a first amplifier output stage (18-1) having an output coupled to produce a first output signal (Vout⁺), each of the first (14-1) and second (16-1) current mirrors including an input (IN) and a first output (OUT1), the first outputs (OUT1) of the first (14-1) and second (16-1) current mirrors being coupled to a first compensation capacitance (Cc1) and to an input of the first amplifier input stage (18-1), a second feedback amplifier (11-2) including third (14-2) and fourth (16-2) current mirrors, a second amplifier input stage (12-2) having an input coupled to a second input signal (Vin⁻) and an output (30-2), and a second amplifier output stage (18-2) having an output coupled to produce a second output signal (Vout⁻), each of the third (14-2) and fourth (16-2) current mirrors including an input (IN), a first output (OUT1), and a second output (OUT2), the first outputs (OUT1) of the third (14-2) and fourth (16-2) current mirrors being coupled to a second compensation capacitance (Cc2) and to an input of the second amplifier input stage (18-2), a second output (OUT2) in each of the first (14-1), second (16-1), third (14-2) and fourth (16-2) current mirrors, means (13-1) for coupling an upper bias terminal of the first amplifier input stage (12-1) to the input (IN) of the first current mirror (14-1) and the second output (OUT2) of the fourth current mirror (16-2) and means (15-1) for coupling a lower bias terminal of the first amplifier input stage (12-1) to the input (IN) of the second current mirror (16-1) and the second output (OUT2) of the third current mirror (14-2) to cause signals at the second outputs (OUT2) of the third (14-2) and fourth (16-2) current mirrors to oppose signals at the inputs (IN) of the second (16-1) and first (14-1) current mirrors, respectively, in response to a common mode component of a differential input signal (Vin⁺−Vin⁻) equal to the difference between the first (Vin⁺) and second (Vin⁻) input signals, and means (13-2) for coupling an upper bias terminal of the second amplifier input stage (12-2) to the input (IN) of the third current mirror (14-2) and the second output (OUT2) of the second current mirror (16-1) and means (15-1) for coupling a lower bias terminal of the second amplifier input stage (12-2) to the input (IN) of the fourth current mirror (16-2) and the second output (OUT2) of the first current mirror (14-1) to cause signals at the second outputs (OUT2) of the first (14-1) and second (16-1) current mirrors to oppose signals at the inputs (IN) of the fourth (16-2) and third (14-2) current mirrors, respectively, in response to the common mode component of the differential input signal (Vin⁺−Vin⁻).

DETAILED DESCRIPTION OF THE PREFERRED EMBODIMENTS

Figure 1:
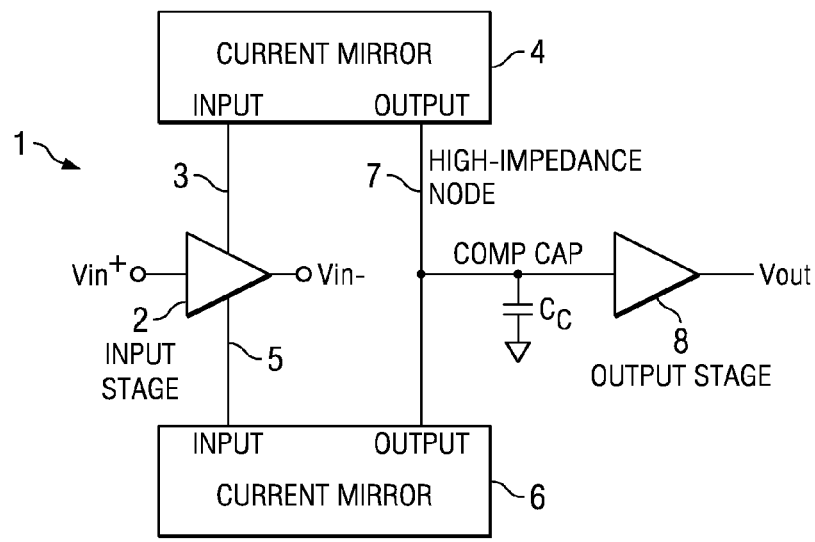
FIG. 1 is a block diagram of a conventional current feedback amplifier.
Figure 2A:
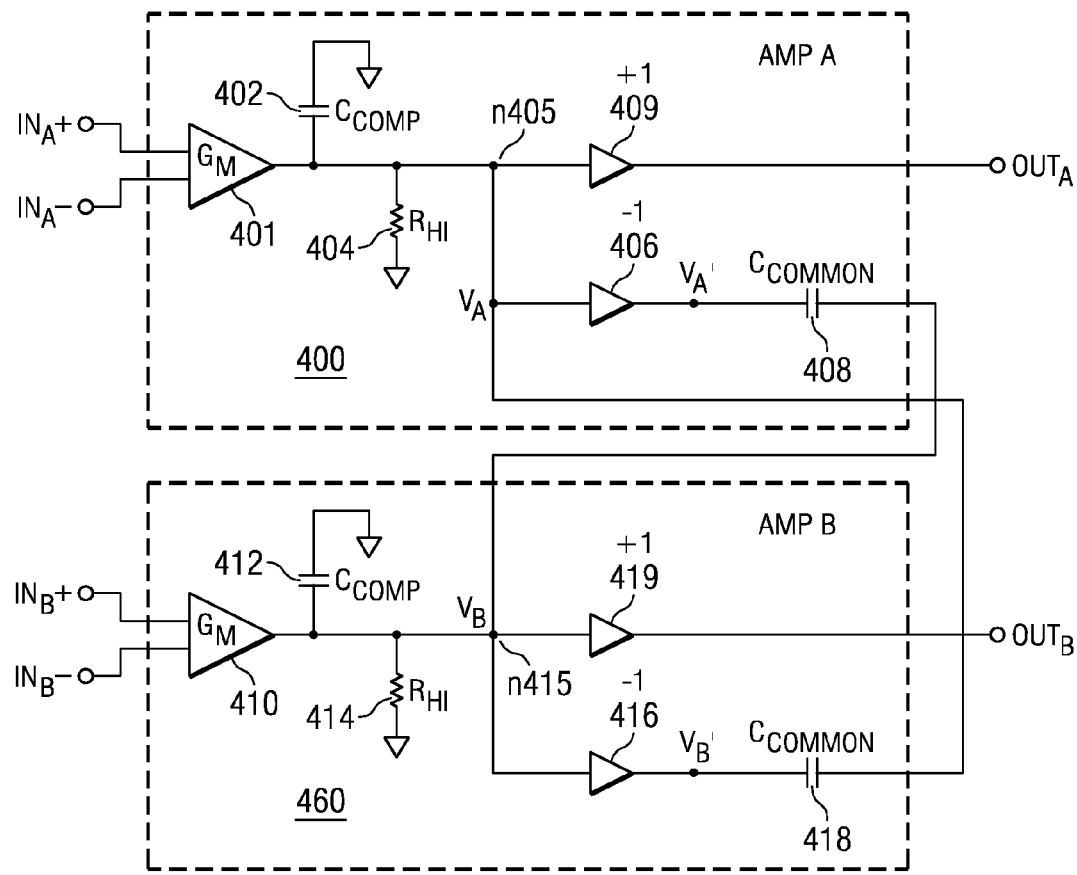
FIG. 2A is a schematic diagram of the circuit shown in FIG. 4 of U.S. Pat. No. 6,867,649.
Figure 2B:
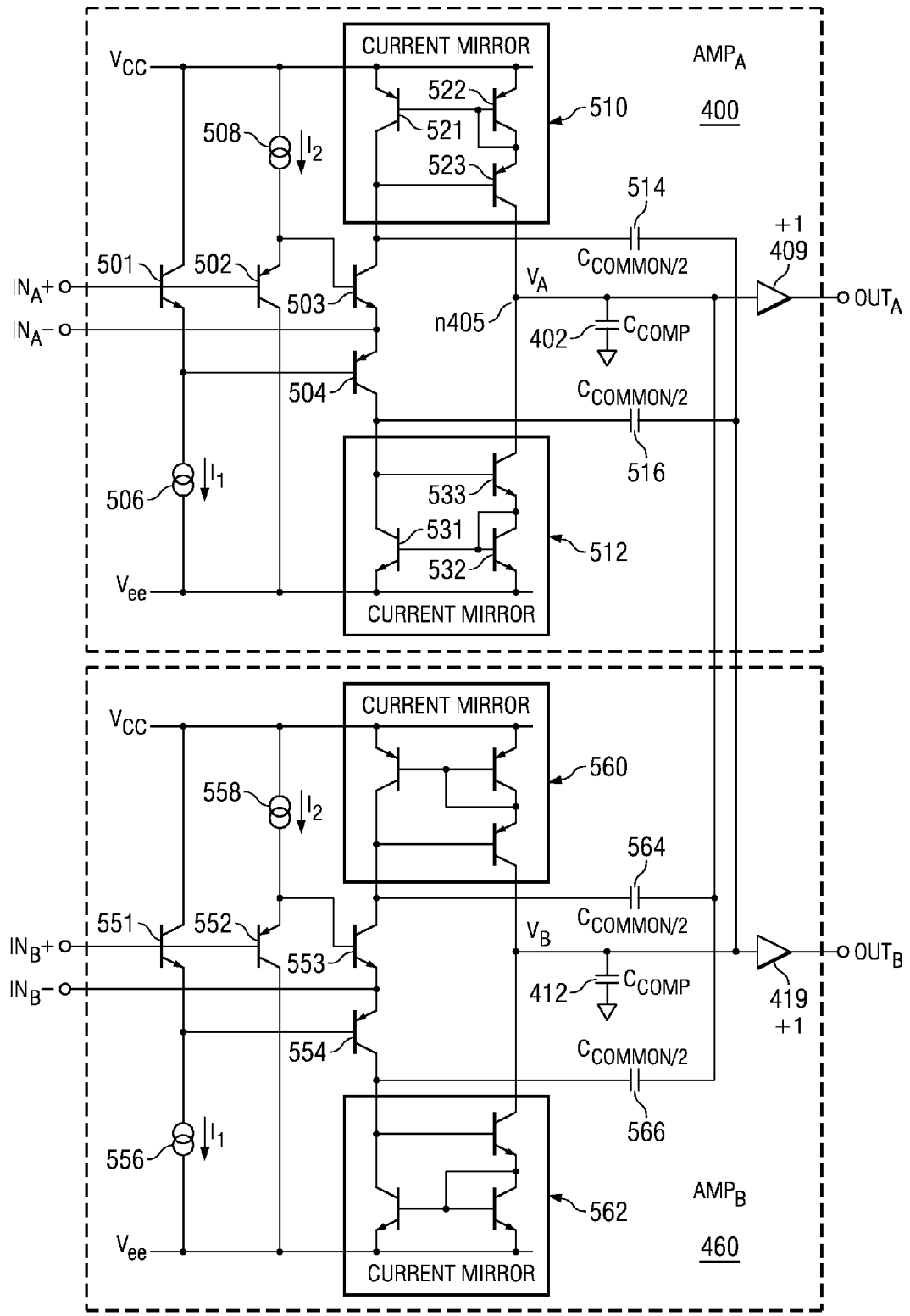
FIG. 2B is a schematic diagram of the circuit shown in FIG. 4 of U.S. Pat. No. 6,867,649.
Figure 3:
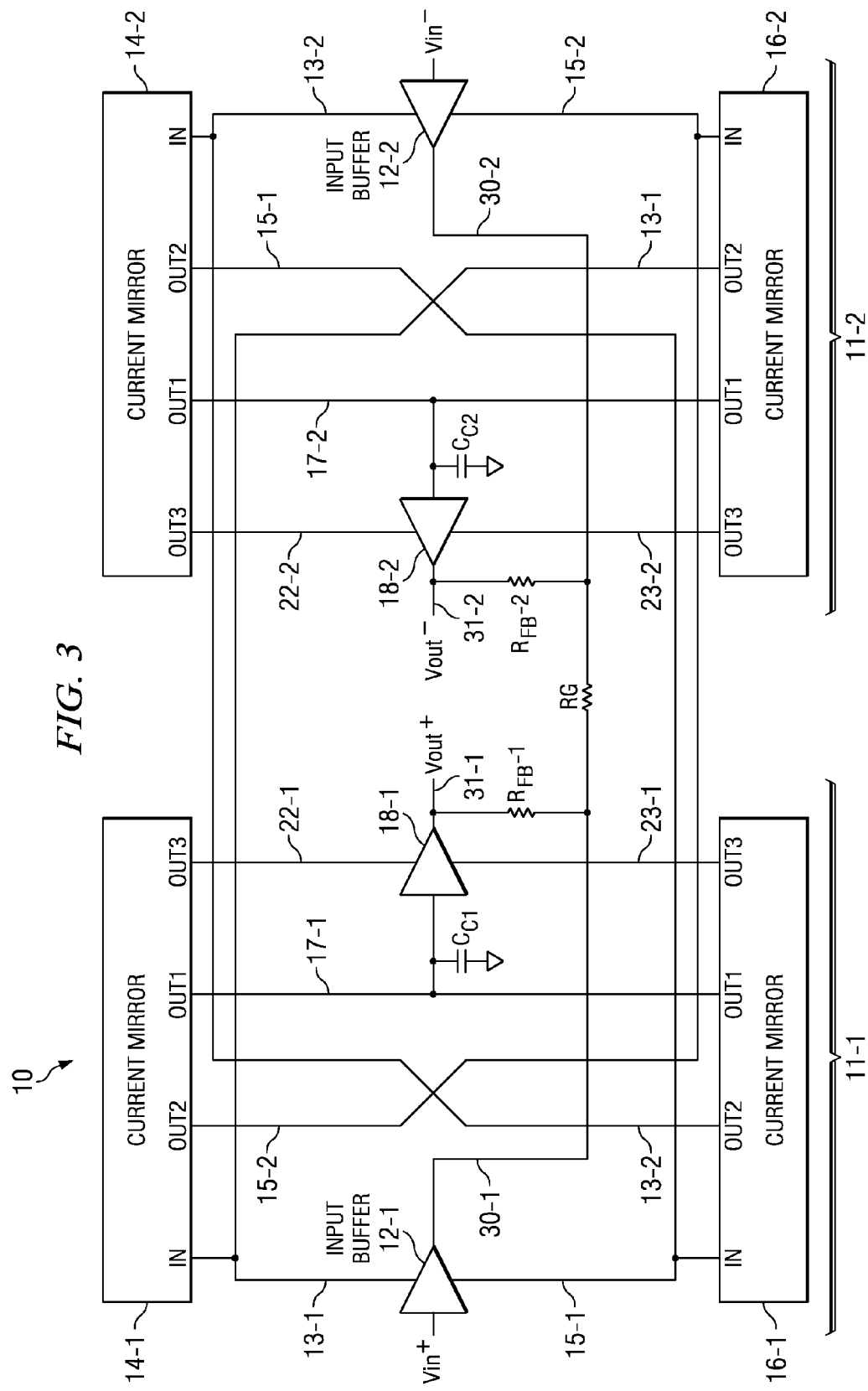
FIG. 3 is a block diagram of a differential driver circuit of the present invention.

A proposed solution to the previously mentioned common mode instability problem in amplifier driver circuits is shown in FIG. 3. The typical current mirrors with one input and one output are replaced with current mirrors having one input and at least 2 outputs. The first outputs (OUT1) of each current feedback amplifier are connected together to form the high impedance node, which is the same as in a typical CFA. The second outputs (OUT2) of each current feedback amplifier, on the other hand, are connected to the opposite current mirror inputs of the complementary amplifier. These additional current mirror outputs function differently in relation to common mode and differential mode signals.

For differential mode signals, the voltage on the input of each current feedback amplifier is 180° out of phase with the voltage on the input of the other current feedback amplifier. Here the additional current mirror outputs in each current feedback amplifier will function symbiotically, i.e., in a mutually supporting or constructive manner, with the current feedback complementary amplifier. This allows the individual amplifiers to be compensated to operate at the maximum bandwidth for the desired higher gain. Conversely, for common mode signals, the voltage on the input of each current feedback amplifier is in phase with the voltage on the input of the other current feedback amplifier. In this case the additional current mirror outputs in each current feedback amplifier will function in opposition to the input signal of the other (complementary) feedback amplifier. This has the effect of substantially diminishing the common mode transconductance, thereby causing the common mode bandwidth to be reduced to about a third of the differential mode bandwidth. This greatly reduces the possibility of common mode instability.

FIG. 3 a shows a differential amplifier driver circuit 10 which includes two basic current feedback amplifiers 11-1 and 11-2 coupled in such a way that when amplifying a differential input signal, the two current feedback amplifiers 11-1 and 11-2 appear functionally equivalent to two ordinary current feedback amplifiers, but when amplifying a common mode input signal they appear to be operating at much lower bandwidth. Each current feedback amplifier is composed of an input buffer, an upper and lower current mirror, and an output buffer.

In FIG. 3, current feedback amplifier 11-1 includes an input buffer 12-1 (which typically is a diamond buffer) having an input connected to receive an input signal Vin+ and output connected to conductor 30-1, an upper bias voltage terminal connected by conductor 13-1 to the input IN of an upper current mirror 14-1, and a lower bias voltage terminal 15-1 coupled to the input IN of a lower current mirror 16-1. An output voltage Vout+ is produced by an output stage 18-1 on conductor 31-1. A first output OUT1 of upper current mirror 14-1 and a first output OUT1 of lower current mirror 16-1 are connected by a conductor 17-1 to the input of output stage 18-1 and to one terminal of a compensation capacitor Cc1 having its other terminal connected to ground. A second output OUT2 of upper current mirror 14-1 is connected to a conductor 15-2, and a second output OUT2 of lower current mirror 16-1 is connected to a conductor 13-2. An optional third output OUT3 of upper current mirror 14-1 can be connected by conductor 22-1 to provide feed-forward or dynamic bias to an upper bias terminal of output stage 18-1, and an optional third output OUT3 of lower current mirror 16-1 can be connected by conductor 23-1 to provide feed-forward or dynamic bias to a lower bias terminal of output stage 18-1. An output of output stage 18-1 is connected by a conductor 31-1 to one terminal of a feedback resistor $R_{FB}$-1, the other terminal of which is connected to conductor 30-1. Conductor 30-1 is also connected to one terminal of a gain resistor RG, the other terminal of which is connected to conductor 30-2.

Similarly, current feedback amplifier 11-2 includes an input buffer 12-2, which also typically is a diamond buffer, having an input connected to receive an input signal Vin− and an output connected to conductor 30-2, on which an output signal Vout− is produced. Input buffer 12-2 includes an upper bias voltage terminal connected by conductor 13-2 to the input IN of an upper current mirror 14-2, and is cross-coupled by conductor 13-2 to the second output OUT2 of lower current mirror 16-1 of current feedback amplifier 11-1. Input buffer 12-2 of current feedback amplifier 11-2 also has a lower bias voltage terminal coupled by conductor 15-2 to the input IN of a lower current mirror 16-2, and also is cross-coupled by conductor 15-2 to the second output OUT2 of upper current mirror 14-1 of current feedback amplifier 11-1. A first output OUT1 of upper current mirror 14-2 and a first output OUT1 of lower current mirror 16-2 are connected by a conductor 17-2 to the input of an output stage 18-2 and to one terminal of a compensation capacitor Cc2 having its other terminal connected to ground. A second output OUT2 of upper current mirror 14-2 is connected to conductor 15-1, and a second output OUT2 of lower current mirror 16-2 is connected to conductor 13-1. An optional third output OUT3 of upper current mirror 14-2 can be connected by conductor 22-2 to an upper bias terminal of output stage 18-2, and an optional third output OUT3 of lower current mirror 16-2 can be connected by conductor 23-2 to a lower bias terminal of output stage 18-2. An output of output stage 18-2 is connected by a conductor 31-2 to one terminal of a feedback resistor $R_{FB}$-2, the other terminal of which is connected to conductor 30-2. Conductor 30-2 is also connected to gain resistor RG, the other terminal of which is connected to conductor 30-1. The feed forward bias or dynamic bias mentioned above provides increased large signal output stage performance.

Before describing the operation of differential amplifier driver circuit 10 of FIG. 3, it may be helpful to better understand the need to have different bandwidths for differential mode and common mode operation.

Figure 4:
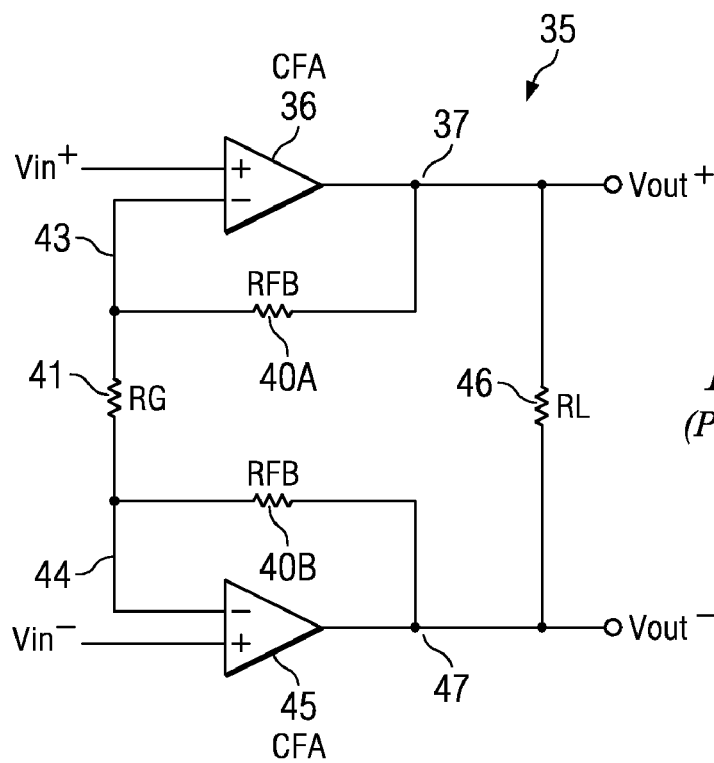
FIG. 4 is a schematic diagram of a Prior Art preferred line driver configuration including two current feedback amplifiers.

To this end, the differential amplifier driver circuit 35 shown in FIG. 4 is a typical circuit configuration for the line driver application. In the circuit of FIG. 4, two current feedback amplifiers 36 and 45 are configured to form a differential amplifier. The conventional differential driver of FIG. 4 is illustrative of the common mode instability problem. The (+) inputs of current feedback amplifiers 36 and 45 receive the input signals Vin+ and Vin−, respectively. A gain resistor 41 having a resistance RG is coupled between the (−) inputs of current feedback amplifiers 36 and 45 by means of conductors 43 and 44, respectively. The output 37 of current feedback amplifier 36, on which an output voltage Vout + is produced, is connected to one terminal of feedback resistor 40A of resistance RFB. The other terminal of resistor 40A is connected to conductor 43. Similarly, the output 47 of current feedback amplifier 45, on which an output voltage Vout− is produced, is connected to one terminal of feedback resistor 40B of resistance RFB. The other terminal of resistor 40B is connected to conductor 44. A load resistor 46 of resistance RL is coupled between conductors 37 and 47.

Figure 5:
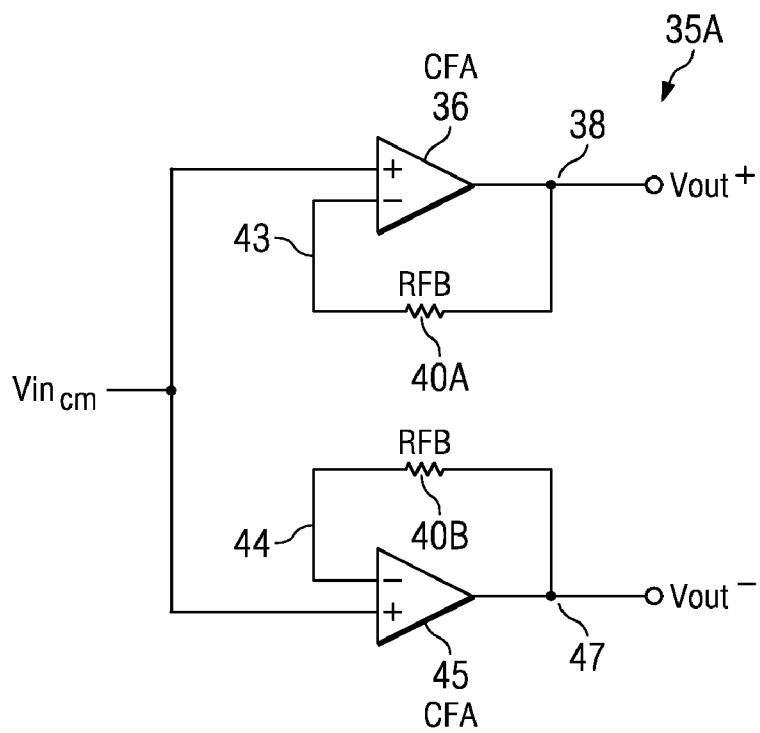
FIG. 5 is a schematic diagram of a common mode equivalent circuit of the circuit shown in FIG. 4.

The gain of differential amplifier driver circuit 10 of FIG. 3 is usually between 4 and 10, so current feedback amplifiers used in this application are usually optimized for gains greater than one, usually 4 or 5. It is known that because the input buffer (which typically is a diamond buffer) used in current feedback amplifiers 36 and 45 of Prior Art FIG. 4 has non-zero output impedance, the feedback resistors RFB-1 and RFB-2, both of which have a resistance RFB, must increase in value to compensate for this if they are to be used at a lower gain. Failure to achieve the increase in feedback resistance can cause the circuit to be unstable and prone to oscillation. To see the relevance of this in the differential driver circuit 35 of Prior Art FIG. 4, consider its common mode equivalent circuit 35A as shown in FIG. 5. First, it should be noted that for common mode input voltages present on conductors 43 and 44, the (−) inputs of current feedback amplifiers 36 and 45, are identical. Because of this, no current flows in the gain element RG of current feedback amplifier 35 and therefore gain element RG appears as an open circuit in common mode equivalent circuit 35A. It therefore is true that current feedback amplifiers 36 and 45 appear to have a gain of unity for common mode input signals.

This is what usually leads to an unstable application circuit, and therefore it is desirable to use a current feedback amplifier that compensates for this fact. (This is because the amplifiers are compensated (optimized to operate) at a gain of about 5 or above. Therefore, they may be unstable if they are operated at unity gain. This is a known fact in current feedback amplifier theory regarding the non-zero buffer output impedance. The bandwidth of an operational amplifier, to the first order, is gm/C, where C is the compensation capacitance (in a current feedback amplifier, gm=1/RFB), so there are essentially two ways to change the compensation of the current feedback amplifier. One way is to increase the size of the compensation capacitor and the other is to increase the size of the feedback resistance RFB. By the nature of the application circuit, two signal paths, a differential path as shown in FIG. 4, and a common mode path as shown in FIG. 5, exist simultaneously. The differential path has gain Vod/Vid=(1+RFB/RG), where"Vod" and "Vid" are the differential input and output voltages, and the common mode path has gain Vod/Vid=1. These two signal paths have different gm/C requirements to ensure stability. So what is needed is for the two compensation schemes to exist simultaneously in the amplifier driver circuit, and this is what the present invention accomplishes. It produces an apparent increase by a factor of 3 in the feedback resistance, which corresponds to a 3×reduction of the transconductance in the common mode signal path. U.S. Pat. No. 6,867,649 discloses use of a larger capacitance C in the common mode path.) The present invention provides a kind of common mode compensation that achieves this without the above mentioned shortcomings of the closest prior art, including limited full power bandwidth and high internal power dissipation.

Figure 6:
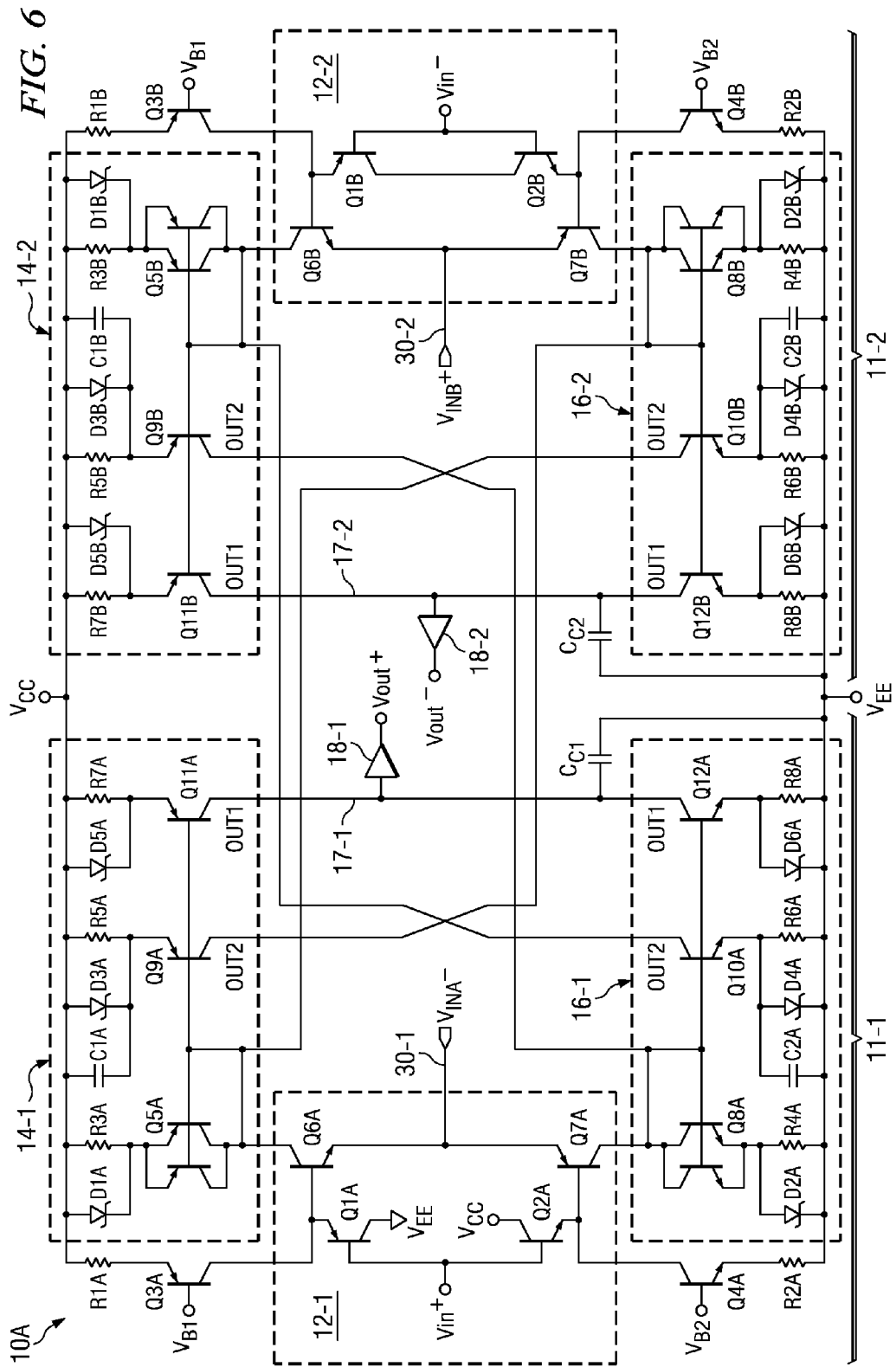
FIG. 6 is a detailed schematic diagram of the input and gain stages of the differential driver circuit of FIG. 3.

The input and gain stages of differential amplifier driver circuit 10A are shown in FIG. 6. (For convenience, the connections of gain resistor RG and feedback resistors $R_{FB}$-1 and $R_{FB}$-2 in FIG. 3 are not shown in FIG. 6). Referring to FIG. 6, input stage 12-1 includes a conventional basic diamond follower which includes PNP transistor Q1A and NPN transistor Q2A having their bases coupled to receive Vin⁺. The emitter of transistor Q1A receives current from PNP transistor Q3A, and also is connected to the base of NPN transistor Q6A, the emitter of which is connected by conductor 30-1 to one terminal of gain resistor RG as indicated in FIG. 3. The emitter of transistor Q2A receives current from NPN transistor Q4A and also is connected to the base of PNP transistor Q7A, the emitter of which is connected to conductor 30-1. The collector of transistor Q6A is connected to the collector and base of current mirror input transistor Q5A of upper current mirror 14-1, and the collector of transistor Q7A is connected to the collector and base of current mirror input transistor Q8A of lower current mirror 16-1. PNP current mirror output transistor Q11A supplies current through the OUT1 port of current mirror 14-1 to conductor 17-1 and NPN current mirror output transistor Q12A sinks current from conductor 17-1 through the OUT1 port of current mirror 16-1. The circuitry of current feedback amplifier 11-2 is completely symmetrical to that of current feedback amplifier 11-1.

A suitable implementation of output stages 18-1 and 18-2 as shown in FIGS. 3 and 6 is the known circuit shown in FIG. 3 of the assignee's pending patent application Ser. No. 11/890,682, assignee docket number TI-64162, entitled "Low Quiescent Current Output Stage and Method with Improved Output Drive" filed Aug. 7, 2007, by Paul G. Damitio.

The input stage of each current feedback amplifier 11-1 and 11-2 in differential amplifier driver circuit 10A as shown in FIG. 6 is a basic diamond buffer, as indicated by dashed lines 12-1 and 12-2. Individually, the diamond buffer is prone to rather high offsets because of the mismatch between the NPN and PNP transistor based-emitter voltage VBE but since differential amplifier driver circuit 10A will be used exclusively in differential configurations, these mismatches will appear as common mode offsets rather than as signal errors.

Unlike the current mirrors in most current feedback amplifiers, where the current mirror ratio of input current to output current is 1:1, current mirrors 14-1, 14-2, 16-1 and 16-2 of differential amplifier driver circuit 10 have a ratio of 2:1. That is, the diode-connected current mirror input transistors Q5A and Q5B have two times the current of the current mirror output transistors such as Q9A, Q9B, Q11A and Q11B. This arrangement is part of the common mode compensation circuitry. Since the diode-connected current mirror input transistors Q5A and Q5B are degenerated with 125 ohm degeneration resistors R3A and R3B, respectively, it follows that the current mirror output transistors are degenerated with 250 ohm degeneration resistors R5A, R5B, R7A, and R7B. The degeneration resistors are each bypassed with Schottky diodes D1A, D3A, D5A and D1B, D3B and D5B to prevent the voltage drop across the degeneration resistors from exceeding about 400 millivolts during slew conditions or during input overdrive conditions.

To achieve the desired compensation during amplification of common mode input signals, a second set of current mirror output transistors Q9A,Q10A and Q9B, 10B are added to the current mirrors of each of the current feedback amplifiers 11-1 and 11-2, as shown. The output of the additional NPN current mirror output transistor Q10A in amplifier 11-1 is connected to the PNP diode-connected current mirror input transistor Q5B of amplifier 11-2 and the output of the additional PNP current mirror output transistor Q9A in amplifier 11-1 is connected to the diode-connected NPN current mirror input transistor Q8A of amplifier 11-2. Similarly, the output of the additional NPN current mirror output transistor Q10B in amplifier 11-2 is connected to the diode-connected PNP current mirror input transistor Q5A of amplifier 11-1 and the output of the additional PNP current mirror output transistor Q9B in amplifier 11-2 is connected to the diode-connected NPN current mirror input transistor Q8A of amplifier 11-1.

Thus, under quiescent conditions each diode-connected current mirror input transistor receives half its current from its own buffer outputs with the other half being supplied from the additional current mirror outputs of the complementary current feedback amplifier. With this arrangement, the current feedback amplifiers 11-1 and 11-2 function in a complementary fashion when amplifying differential input signals as would two independent current feedback amplifiers.

However, when amplifying common mode input signals, the current feedback amplifiers 11-1 and 11-2 function in an oppositional manner that produces an apparent 3× reduction in the open loop transimpedance gain and bandwidth of current feedback amplifiers 11-1 and 11-2. A mathematical justification of this follows.

Figure 7:
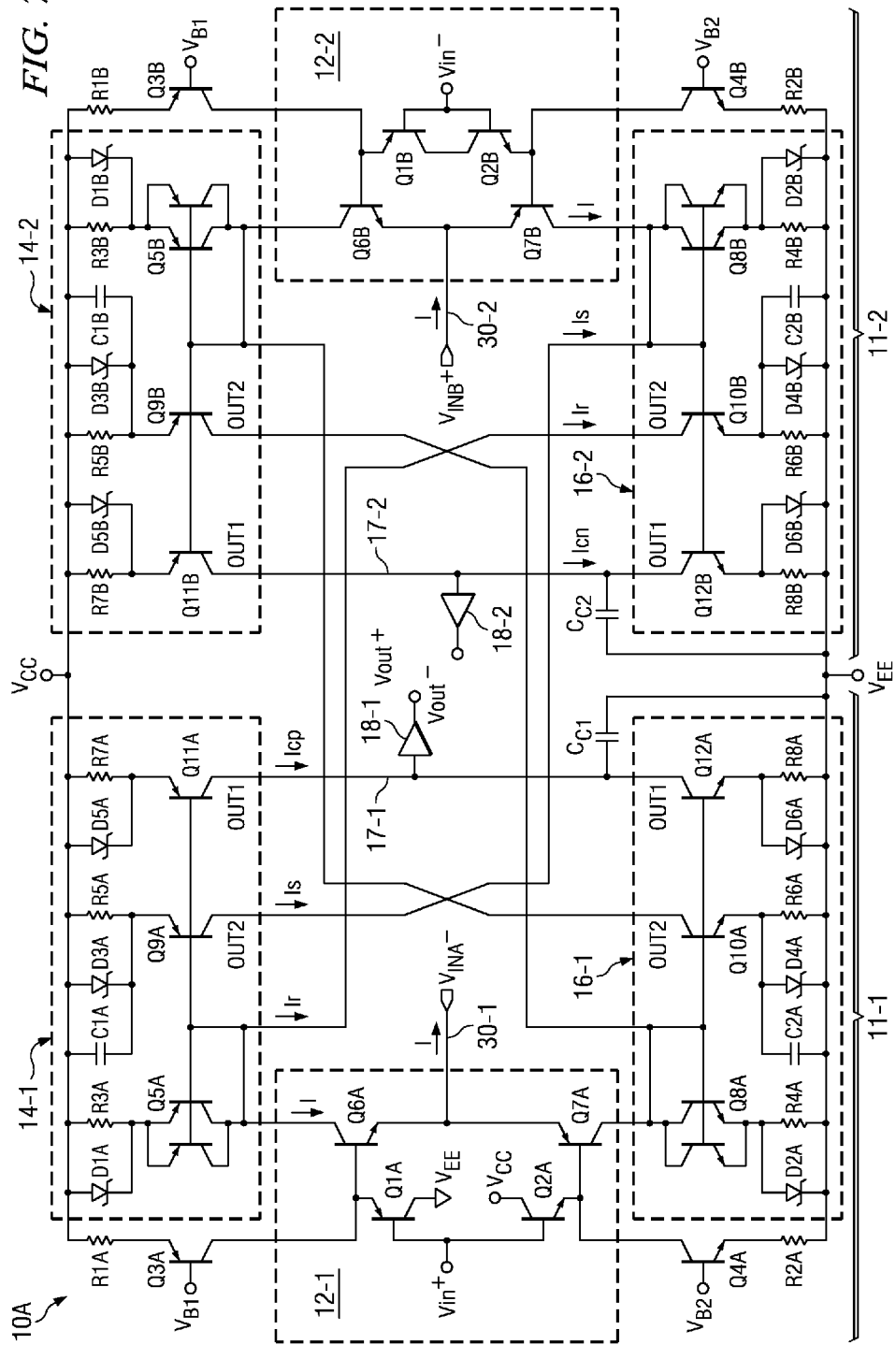
FIG. 7 includes the diagram of FIG. 6 illustrating differential mode signal currents therein.

Referring first to the circuit of FIG. 7, which is identical to FIG. 6 except that various differential signal currents used in the following equations are identified, the signal currents represented by a differential mode input voltage, i.e., the signals at each current mirror input, are 180 degrees out of phase with one another. From FIG. 7, it can be seen that the signal currents are summed in amplifier 11-1 as follows:

$$I_S = \frac{I + Ir}{2}, \qquad \text{Equation (1)}$$

and $$Ir = \frac{I + I_S}{2}, \qquad \text{Equation (2)}$$

where Is is the current sourced by amplifier 11-1 and Ir is the current received from the complementary current feedback amplifier 11-2. Also note that in current feedback amplifier 11-1, current Is is a replica of current Icp and in current feedback amplifier 11-2, Ir is a replica of current Icn in current feedback amplifier 11-1, Icp and Icn being the signal currents into the compensation nodes of each amplifier.

Combining Equations (1) and (2) results in $$I_S = Icp = I, \qquad \text{Equation (3)}$$

and $$Ir = Icn = I, \qquad \text{Equation (4)}$$

as would be the case for two independent current feedback amplifiers.

Figure 8:
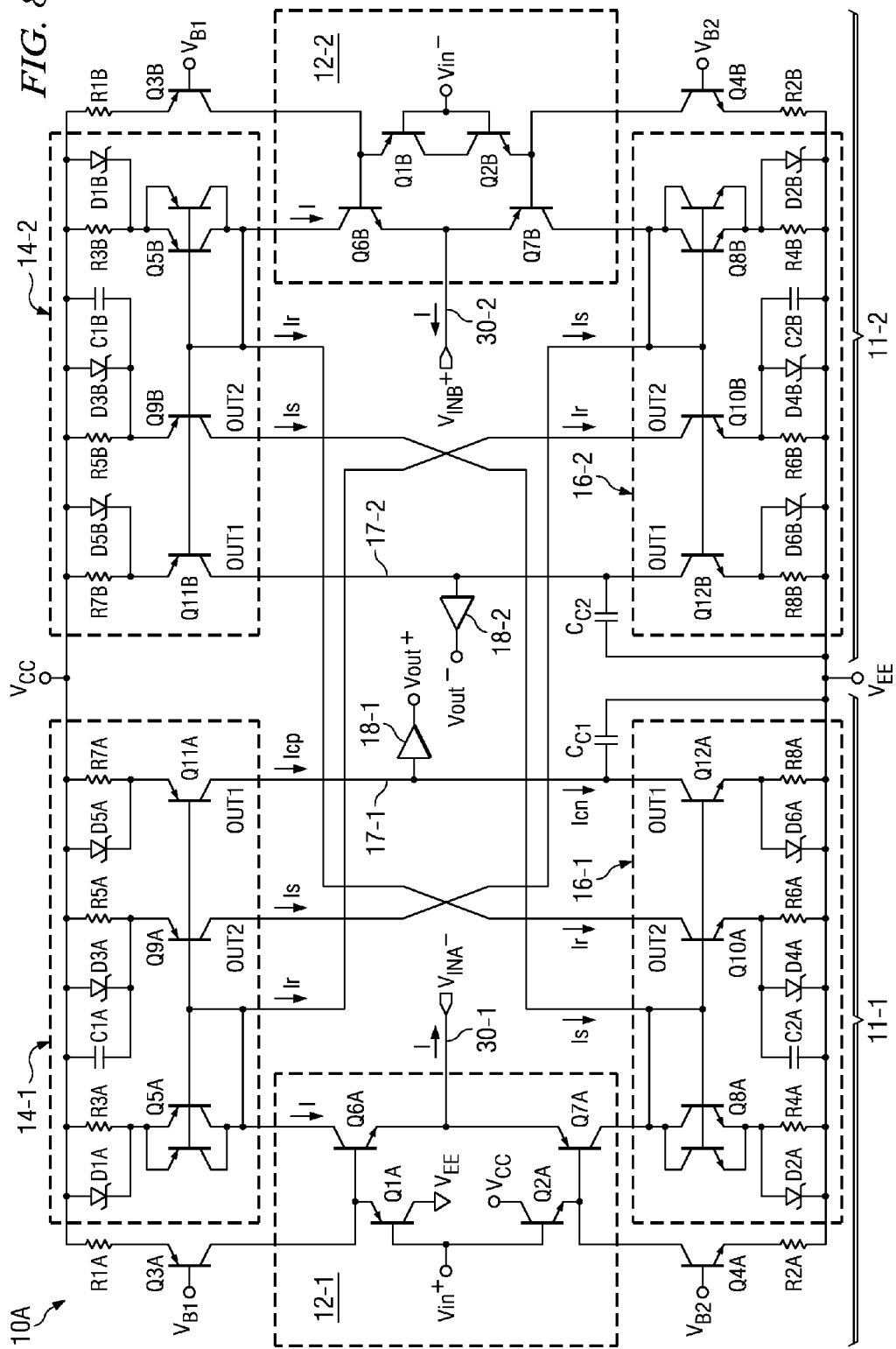
FIG. 8 includes the diagram of FIG. 6 illustrating common mode signal currents therein.

In the case of common mode, the input signals are in phase with one another. In this scenario, the signal currents are as shown in FIG. 8, which is identical to FIG. 6 except that certain common mode currents used in the following equations are identified. Summing these currents in amplifier 11-1 results in $$I_S = \frac{I + Ir}{2}, \qquad \text{Equation (5)}$$

and $$Ir = \frac{I_S}{2}. \qquad \text{Equation (6)}$$

Combining Equations (5) and (6) results in $$I_S = \frac{2}{3}I. \qquad \text{Equation (7)}$$

Note that the currents Is and Ir are replicas of the currents at the high impedance node. Setting up these equalities results in $$Icp = I_S = \frac{2}{3}I, \qquad \text{Equation (8)}$$

and $$Icn = Ir = \frac{I_S}{2} = \frac{1}{3}I. \qquad \text{Equation (9)}$$

Equation (8) shows that the signal current at the compensation node has been reduced by one third. But in addition to this, an oppositional current has been set up in the NPN current mirror. These currents are summed at the high impedance node. The result can be represented mathematically by combining Equations 8 and 9. Letting this current equal Ic results in $$Ic = \frac{1}{3}I. \qquad \text{Equation (10)}$$

Figure 9:
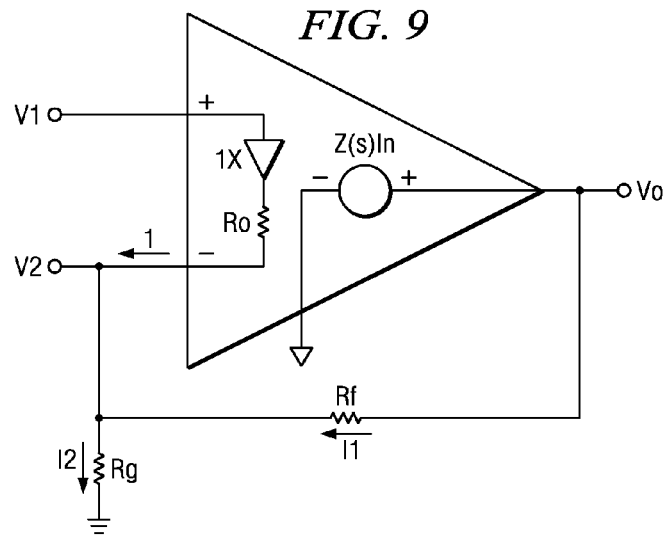
FIG. 9 is a schematic diagram of a equivalent circuit of a current feedback amplifier.

This shows that the transimpedance gain of the amplifier has been reduced by a factor of three. To see how this result affects the frequency response of the amplifier, it is helpful to refer to the equivalent circuit of a current feedback amplifier as shown in FIG. 9. For the purpose of this discussion, Ro is equal to zero and V1=V2 and I=I1-I2. With this, an equation can be set up for the transfer function V0/V1. So from the above and FIG. 7 it follows that $$I = \frac{Vi}{Rg} - \frac{Vo - Vi}{Rf}. \qquad \text{Equation (11)}$$

Normally, the current In is equal to I, But from 10 we have Ic=In=I/3. So, $$I = \frac{3Vo}{Z(s)}, \qquad \text{Equation (12)}$$

where $Z(s) = N(s)/D(s)$ is the open loop frequency dependent transfer function of the amplifier wherein N(s) and D(s) are the numerator and denominator of the transfer function and define its zeros and poles, respectively.

Substituting Equation 12 into Equation 11 and solving for Vo/V1, provides $$\frac{Vo}{Vi} = \frac{1 + \frac{Rf}{Rg}}{1 + \frac{3Rf}{Z(s)}}. \qquad \text{Equation (13)}$$

For $G = 1 + \frac{Rf}{Rg}$, and $Z(s) = \frac{N(s)}{D(s)}$,

Equation (13) can be in its more recognizable standard form, which is $$\frac{Vo}{Vi} = G\frac{N(s)}{N(s) + 3RfD(s)}. \qquad \text{Equation (14)}$$

Thus, when the common mode equivalent circuit is examined, it can be seen from Equation 10 that the open loop transimpedance gain has been reduced by a factor of 3 and from Equation 14 it can be seen that the $g_m$ of the circuit has been reduced by a factor of 3 as well. Since the unity gain bandwidth is $g_m/C$, it follows that the common mode bandwidth has been reduced by a factor of 3 from that of the differential mode bandwidth.

It should be noted that the foregoing factor of 3 assumes ideal transistor parameters. With normal transistor betas (current gains) in the range of 50 to 100, this factor will be in the range of 2.5 to 2.9.

Figure 10:
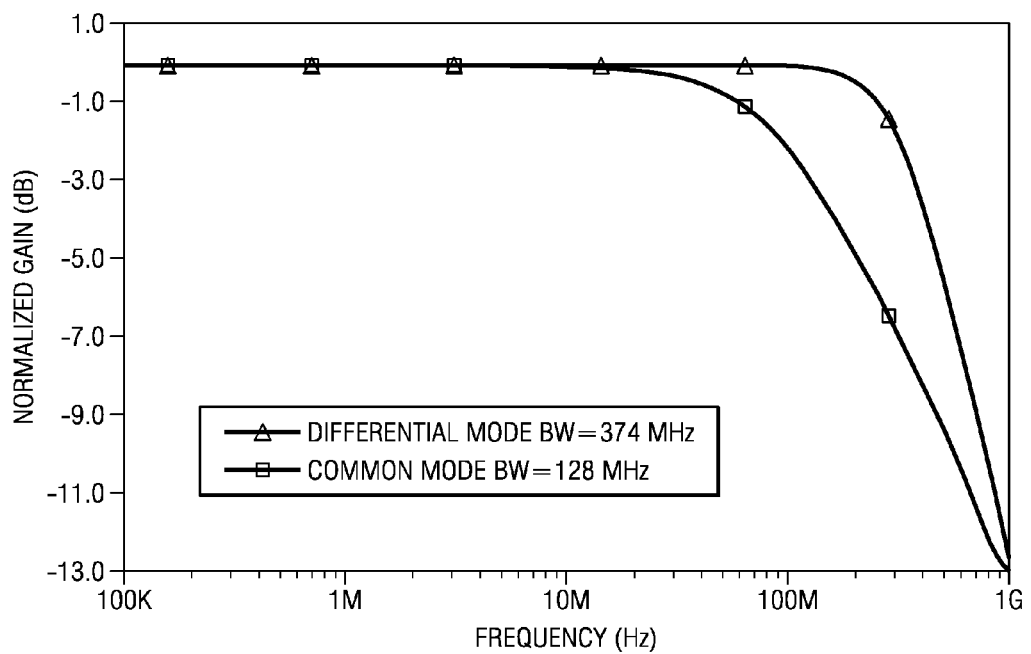
FIG. 10 is a graph illustrating the frequency responses of the differential amplifier driver circuit of FIG. 3 in response to differential input signals and common-mode input signals, respectively.

FIG. 10 shows a comparison of the bandwidths in differential mode vs. common mode. The "common mode" bandwidth curve rolls off at roughly 128 MHz and the "differential mode" bandwidth curve rolls off at roughly 374 MHz. This illustrates the fact that if amplifier driver circuit 10 is operating in its common mode, the "3" in the denominator of Equation (14) is present, and if amplifier driver circuit 10 is operating in its differential mode, the "3" is replaced by "1".

The above described embodiment of the present invention is based on DC coupling of the amplifiers, whereas the earlier solution of the problems of the prior art was based on AC coupling with compensation caps.

Most users of differential amplifier driver circuits presently utilize those which contain current feedback amplifiers. However, if the common mode instability problem could be overcome for voltage feedback amplifiers, then voltage feedback amplifiers could be used in differential driver applications and thereby achieve the benefits of voltage feedback amplifiers, which include increased flexibility in selecting the feedback resistance RFB, two high impedance inputs, and possibly lower overall noise. Although this has previously been attempted, difficulties have been encountered because of common mode instability.

A voltage feedback amplifier, if compensated for a high gain, will ordinarily become unstable if the gain is substantially decreased. Theoretically, a current feedback amplifier, irrespective of its gain, should be stable as long as the feedback resistance Rf is constant. But the Ro term shown in FIG. 9 changes that, because if Ro is not equal to zero, it is necessary to adjust the feedback resistance Rf as the gain is changed in order to maintain the bandwidth for which the circuit is frequency-compensated. So if the basic idea of the present invention is extended into a voltage feedback amplifier, one could use an amplifier that is frequency-compensated for a higher gain in a driver amplifier circuit to provide common mode stability.

Some voltage feedback amplifiers which have internal current feedback also could benefit from the separate differential mode compensation and common-mode compensation of the present invention. In a voltage feedback amplifier, both of the inputs are high impedance inputs. In FIG. 9, the input V2 would be applied to the input of an internal 1×buffer having its output connected to the lower end of the resistance Ro, which in this case would be a transconductance resistor Rgm. In FIG. 9, the gm element transforms the input voltage into a current by means of a transconductance.

Figure 11:
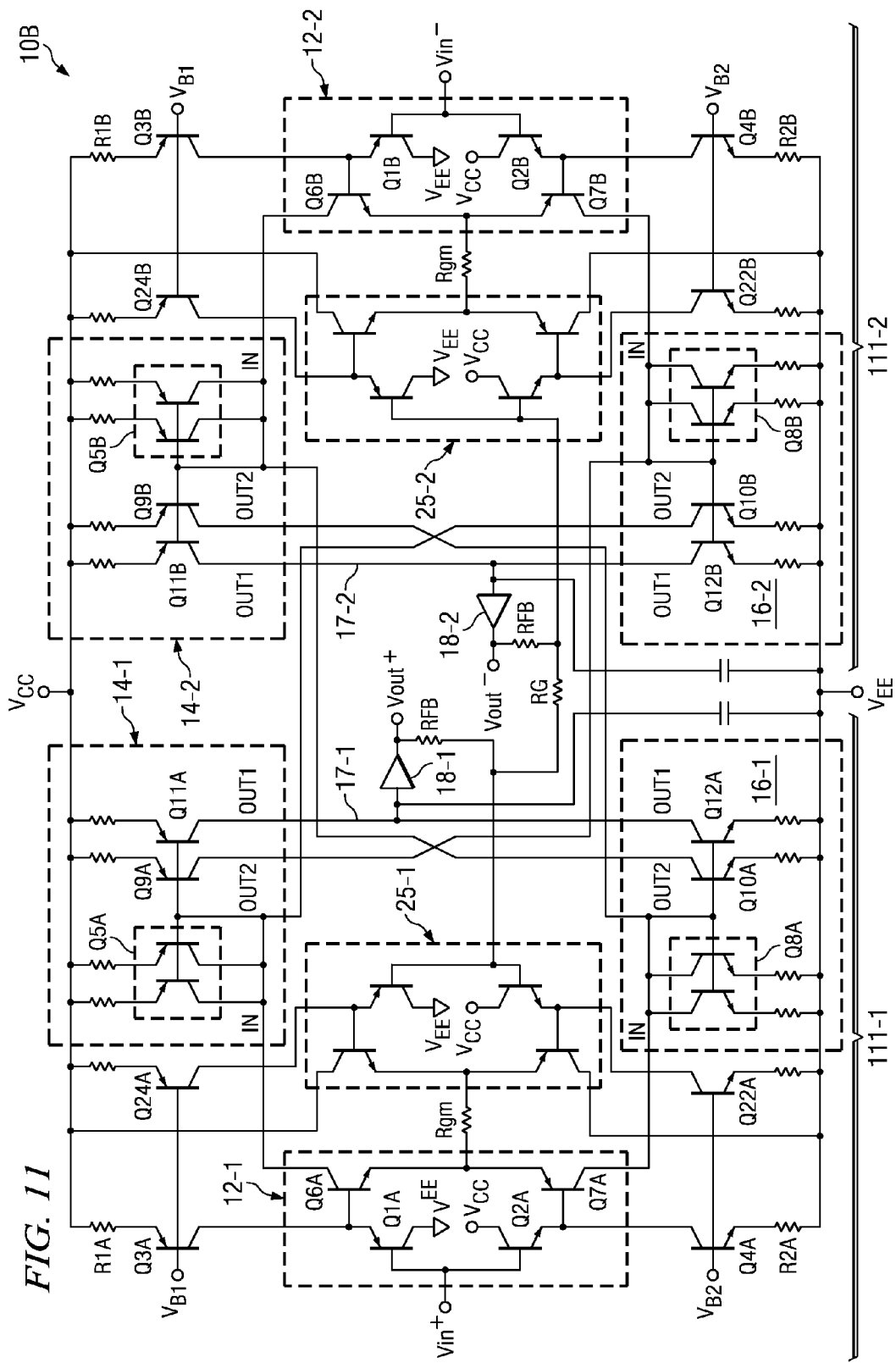
FIG. 11 is a block diagram of another differential amplifier driver circuit of the present invention that is similar to that of FIG. 3 except that voltage feedback amplifiers are used rather than current feedback amplifiers.

FIG. 11 shows an amplifier driver circuit 10B which is similar to the amplifier driver circuit 10 of FIG. 3 and amplifier driver circuit 10A of FIG. 6, except that amplifier driver circuit 10B of FIG. 11 is composed of two voltage feedback amplifiers 111-1 and 111-2 instead of two current feedback amplifiers. Where appropriate, the same reference numerals are used in FIG. 11 as an FIGS. 3 and 6.

In FIG. 11, voltage feedback amplifier 111-1 includes a diamond buffer 12-1, the input of which receives the input voltage Vin⁺. The output of diamond buffer 12-1 is coupled by a transconductance resistor Rgm to the output of another diamond buffer 25-1, the input of which is coupled to one terminal of a gain resistor RG. The other terminal of gain resistor RG is connected to the input of a diamond buffer 25-2 of "complementary" voltage feedback amplifier 111-2, which is essentially identical to voltage feedback amplifier 111-1. Voltage feedback amplifier 111-2 includes a diamond buffer input stage 12-2 the output of which is coupled by another transconductance resistor Rgm to the output of diamond buffer 25-2. The input of diamond buffer 12-2 is connected to receive the input voltage Vin⁻. A feedback resistor RFB is coupled between the output of output stage 18-1 and the input of diamond buffer 25-1, and another feedback resistor RFB is coupled between the output of output stage 18-2 and the input of diamond buffer 25-2. The degeneration resistors in FIG. 11 can be essentially as shown in FIG. 6, and performance can be improved by using Schottky diodes essentially as shown in FIG. 6.

As in FIG. 6, the upper bias terminal of diamond buffer 12-1 in FIG. 11 is connected to the IN terminal of upper current mirror 14-1 and to the OUT2 terminal of lower current mirror 16-2 of voltage feedback amplifier 111-2. The output terminal OUT1 of upper current mirror 14-1 is connected by conductor 17-1 to the input of an output stage 18-1 and to the OUT1 terminal of lower current mirror 16-1 and also to a compensation capacitor. Output OUT2 of upper current mirror 14-1 is connected to the IN terminal of lower current mirror 16-2 of complementary voltage feedback amplifier 111-2. The current mirrors and output stages 18-1 and 18-2 in FIG. 11 are essentially the same as in FIG. 6.

When the basic technique of the present invention as shown in FIGS. 3 and 6 is extended so as to provide the voltage feedback amplifier 10B of FIG. 11, it has the effect of reducing the transconductance gm of the amplifier by a factor of 3. This means that a voltage feedback amplifier which has been compensated to be stable at gains of 3 or greater can be used in the differential driver application shown in FIG. 4 without the danger of common mode instability.

An advantage of the above described embodiments of the invention is that the current feedback amplifiers do not need to charge and discharge large capacitors during the differential mode operation. Common mode gain and bandwidth of a DSL port or any differential pair amplifier is reduced to prevent peaking and oscillations, without reduction of the differential bandwidth.

While the invention has been described with reference to several particular embodiments thereof, those skilled in the art will be able to make various modifications to the described embodiments of the invention without departing from its true spirit and scope. It is intended that all elements or steps which are insubstantially different from those recited in the claims but perform substantially the same functions, respectively, in substantially the same way to achieve the same result as what is claimed are within the scope of the invention. For example, although the described embodiments provide a 3× reduction in bandwidth for common mode operation, it may be possible to have a greater reduction in bandwidth, e.g., a roughly 4× to 6× reduction in bandwidth for common mode operation.

What is claimed is:

1. An amplifier driver circuit comprising:
    a first compensation capacitor;
    a second compensation capacitor;
    a first current mirror having an input, a first output, a second output, and a third output, wherein the first output of the first current mirror is coupled to the first compensation capacitor;
    a second current mirror having an input, a first output, a second output, and a third output, wherein the first output of the first current mirror is coupled to the first compensation capacitor;
    a third current mirror having an input, a first output, a second output, and a third output, wherein the first output of the third current mirror is coupled to the second compensation capacitor;

a fourth current mirror having an input, a first output, a second output, and a third output, wherein the first output is coupled to the second compensation capacitor;

a first amplifier input stage having an input, an output, an upper bias terminal, and a lower bias terminal, wherein the input of the first amplifier input stage receives a first input signal, and wherein the upper bias terminal of the first amplifier input stage is coupled to the input of the first current mirror and to the second output of the fourth current mirror, and wherein the lower bias terminal of the first amplifier input stage is coupled to the input of the second current mirror and to the second output of the third current mirror;

a first amplifier output stage having an input, an upper bias terminal, and a lower bias terminal, wherein the first outputs of the first and second current mirrors are coupled to the input of the first amplifier output stage, and wherein the upper bias terminal of the first amplifier output stage is coupled to the third output of the first current mirror, and wherein the lower bias terminal of the first amplifier output stage is coupled to the third output of the second current mirror;

a second amplifier input stage having an input, an output, an upper bias terminal, and a lower bias terminal, wherein the input of the second amplifier input stage receives a second input signal, and wherein the upper bias terminal of the second amplifier input stage is coupled to the input of the third current mirror and to the second output of the second current mirror, and wherein the lower bias terminal is coupled to the input of the fourth current mirror and to the second output of the first current mirror; and a second amplifier output stage having an input, an upper bias terminal, and a lower bias terminal, wherein the first outputs of the third and fourth current mirrors are coupled to the input of the second amplifier output stage, and wherein the upper bias terminal of the second amplifier output stage is coupled to the third output of the third current mirror, and wherein the lower bias terminal of the second amplifier output stage is coupled to the third output of the fourth current mirror.

2. The amplifier driver circuit of claim 1, wherein the circuit further comprises a gain resistor coupled between the outputs of the first and second amplifier input stages.

3. The amplifier driver circuit of claim 2, wherein the circuit further comprises a first feedback resistor coupled between the outputs of the first amplifier input stage and the first amplifier output stage, and a second feedback resistor coupled between the outputs of the second amplifier input stage and the second amplifier output stage.

4. The amplifier driver circuit of claim 1, wherein the circuit is operative with complementary out-of-phase internal signals in response to a differential component of the differential input signal to effectuate amplification of the differential input signal by a gain substantially greater than 1.

5. The amplifier driver circuit of claim 1, wherein the first and second amplifier input stages each include a diamond buffer circuit.

6. The amplifier driver circuit of claim 5, wherein a ratio of input current to each output current in each of the first, second, third and fourth current mirrors is 2:1.

7. The amplifier driver circuit of claim 6, wherein the first current mirror includes a diode-connected current mirror input transistor and first and second current mirror output transistors, the current mirror input transistor having twice as much current-carrying capability as the first and second current mirror output transistors.

8. The amplifier driver circuit of claim 7, wherein an emitter of the diode-connected current mirror input transistor is coupled to a degeneration resistor having a resistance which is equal to half of the resistance of degeneration resistors coupled to emitters of the first and second current mirror output transistors, respectively.

9. The amplifier driver circuit of claim 8, including Schottky diodes coupled across each of the degeneration resistors, respectively, to prevent overvoltages across the degeneration resistors, respectively.

10. The amplifier driver circuit of claim 1, wherein the first feedback amplifier is a first voltage feedback amplifier and the second feedback amplifier is a second voltage feedback amplifier, and wherein the first amplifier input stage includes a first diamond buffer circuit having an input coupled to the first input signal and a second diamond buffer circuit having an input coupled by a first feedback resistor to the output of the first amplifier output stage and also having an output coupled by a first transconductance resistor to an output of the first diamond buffer circuit, and wherein the second amplifier input stage includes a third diamond buffer circuit having an input coupled to the second input signal and a fourth diamond buffer circuit having an input coupled by a second feedback resistor to the output of the second amplifier output stage and also having an output coupled by a second transconductance resistor to an output of the second diamond buffer circuit, and wherein a gain resistor is coupled between inputs of the second and fourth diamond buffer circuits.

11. An amplifier driver circuit comprising:

a first current mirror having:
- a diode-connected input transistor with an input; and
- a plurality of output transistors, wherein the plurality of output transistors has a first output and a second output, and wherein the diode-connected input transistor has at least twice current-carrying capability as output transistors;

a second current mirror having an input, a first output, and a second output;

a third current mirror having an input, a first output, and a second output, wherein the first output of the third current mirror is coupled to the second compensation capacitor;

a fourth current mirror having an input, a first output, and a second output, wherein the first output is coupled to the second compensation capacitor;

a first amplifier input stage having an input, an output, an upper bias terminal, and a lower bias terminal, wherein the input of the first amplifier input stage receives a first input signal, and wherein the upper bias terminal of the first amplifier input stage is coupled to the input of the first current mirror and to the second output of the fourth current mirror, and wherein the lower bias terminal of the first amplifier input stage is coupled to the input of the second current mirror and to the second output of the third current mirror;

a first amplifier output stage having an input, wherein the first outputs of the first and second current mirrors are coupled to the input of the first amplifier output stage;

a second amplifier input stage having an input, wherein the input of the second amplifier input stage receives a second input signal; and a second amplifier output stage having an input, an upper bias terminal, and a lower bias terminal, wherein the first outputs of the third and fourth current mirrors are coupled to the input of the second amplifier output stage, and wherein the upper bias terminal of the first amplifier output stage is coupled to the third output of the first current mirror, and wherein the lower bias terminal is coupled to the third output of the third current mirror.

12. The amplifier driver circuit of claim 11, wherein the circuit further comprises a gain resistor coupled between the outputs of the first and second amplifier input stages.

13. The amplifier driver circuit of claim 12, wherein the circuit further comprises a first feedback resistor coupled between the outputs of the first amplifier input stage and the first amplifier output stage, and a second feedback resistor coupled between the outputs of the second amplifier input stage and the second amplifier output stage.

14. The amplifier driver circuit of claim 11, wherein the circuit is operative with complementary out-of-phase internal signals in response to a differential component of the differential input signal to effectuate amplification of the differential input signal by a gain substantially greater than 1.

15. The amplifier driver circuit of claim 11, wherein the first and second amplifier input stages each include a diamond buffer circuit.

16. The amplifier driver circuit of claim 15, wherein a ratio of input current of each output current in each of the first, second, third and fourth current mirrors is 2:1.

17. The amplifier driver circuit of claim 16, wherein the second current mirror includes:
a second diode-connected input transistor with an input; and
a plurality of second output transistors, wherein the plurality of second output transistors has a first output and a second output, and wherein the second diode-connected input transistor has at least twice current-carrying capability as second output transistors.

18. The amplifier driver circuit of claim 17, wherein an emitter of the diode-connected current mirror input transistor is coupled to a degeneration resistor having a resistance which is equal to half of the resistance of degeneration resistors coupled to emitters of the first and second current mirror output transistors, respectively.

19. The amplifier driver circuit of claim 18, including Schottky diodes coupled across each of the degeneration resistors, respectively, to prevent overvoltages across the degeneration resistors, respectively.

20. The amplifier driver circuit of claim 11, wherein the first feedback amplifier is a first voltage feedback amplifier and the second feedback amplifier is a second voltage feedback amplifier, and wherein the first amplifier input stage includes a first diamond buffer circuit having an input coupled to the first input signal and a second diamond buffer circuit having an input coupled by a first feedback resistor to the output of the first amplifier output stage and also having an output coupled by a first transconductance resistor to an output of the first diamond buffer circuit, and wherein the second amplifier input stage includes a third diamond buffer circuit having an input coupled to the second input signal and a fourth diamond buffer circuit having an input coupled by a second feedback resistor to the output of the second amplifier output stage and also having an output coupled by a second transconductance resistor to an output of the second diamond buffer circuit, and wherein a gain resistor is coupled between inputs of the second and fourth diamond buffer circuits.

21. An apparatus comprising a pair of feedback amplifier coupled to one another, wherein each of the feedback amplifiers has a transfer characteristic represented by $$\frac{Vo}{V1} = G\frac{N(s)}{N(s) + 3RfD(s)}$$

wherein V1 represents an input of the feedback amplifier, V0 represents an output of the feedback amplifier, Rf is a feedback resistance of the feedback amplifier, N(s) represents the numerator of a transfer function of the amplifier driver circuit in the frequency domain, D(s) represents the denominator of the transfer function in the frequency domain, and G represents a gain of the respective feedback amplifier, and wherein each of the feedback amplifiers includes:
a plurality of current mirrors; and
a plurality of amplifier stages, wherein an input of at least one amplifier stage is coupled to an output of at least one current mirrors from its feedback amplifier, and wherein at least one amplifier stage has a plurality of bias terminals that are each coupled to one of the current mirrors of the other feedback amplifier.

22. The apparatus of claim 21, wherein each feedback amplifier further comprises:
a first current mirror having an input, a first output, and a second output;
a second current mirror having an input, a first output, and a second output,
an amplifier input stage having an input, an output, an upper bias terminal, and a lower bias terminal, wherein the upper bias terminal of the amplifier input stage is coupled to the input of the first current mirror from its feedback amplifier and to the second output of the second current mirror from the other feedback amplifier, and wherein the lower bias terminal of the amplifier input stage is coupled to the input of the second current mirror from its feedback amplifier and to the second output of the first current mirror from the other feedback amplifier; and
an amplifier output stage having an input, wherein the first outputs of the first and second current mirrors from its feedback amplifier are coupled to the input of the amplifier output stage.

23. The apparatus of claim 22, wherein the first and second current mirrors Further comprise a third output and wherein the amplifier output stage further comprises an upper bias terminal and a lower bias terminal, and wherein the upper bias terminal of the amplifier output stage is coupled to the third output of the first current mirror from its feedback amplifier, and wherein the lower bias terminal is coupled to the third output of the second current mirror from its feedback amplifier.

* * * * *